United States Patent [19]
Nitschke

[11] 4,429,236

[45] Jan. 31, 1984

[54] APPARATUS FOR GENERATING PULSES UPON DECREASES IN SUPPLY VOLTAGE

[75] Inventor: Werner Nitschke, Ditzingen, Fed. Rep. of Germany

[73] Assignee: Robert Bosch GmbH, Stuttgart, Fed. Rep. of Germany

[21] Appl. No.: 288,406

[22] Filed: Jul. 30, 1981

[30] Foreign Application Priority Data

Sep. 24, 1980 [DE] Fed. Rep. of Germany ....... 3035896

[51] Int. Cl.³ .................. H03K 5/153; G01R 19/165
[52] U.S. Cl. .................................. 307/362; 307/234; 307/608; 340/663
[58] Field of Search ............... 307/296 R, 64, 130, 307/362, 234, 518, 200 A, 608; 340/661, 662, 663; 361/92

[56] References Cited

U.S. PATENT DOCUMENTS 4,245,150  1/1981  Driscoll et al. ................... 340/663
4,296,338  10/1981  Thomas ............................. 307/362
4,367,423  1/1983  Hornung ........................... 307/350

Primary Examiner—John Zazworsky
Attorney, Agent, or Firm—Frishauf, Holtz, Goodman & Woodward

[57] ABSTRACT

A pulse for resetting computing equipment is generated upon a drop in the supply voltage. In a first embodiment of a circuit furnishing such a reset pulse, a comparator is used whose inverting input is connected to the supply line through a capacitor and to ground potential through a parallel diode-resistor combination. The direct input is connected to the tap of a voltage divider and is connected through a feedback resistor to the output. This circuit can detect drops in supply voltage in the order of the forward drop across the diode. Alternatively, a RC oscillator can be used to generate a reset pulse. If the capacitor in the circuit is not recharged in time by a pulse furnished by the computing equipment being controlled, it is assumed that failure to receive the pulse is indicative of a drop in supply voltage.

9 Claims, 3 Drawing Figures

APPARATUS FOR GENERATING PULSES UPON DECREASES IN SUPPLY VOLTAGE

The present invention relates to electrical circuits for resetting computing equipment such as microprocessors for defined changes in supply voltage.

BACKGROUND OF THE INVENTION

In a well-known apparatus, a reset pulse is applied to a microprocessor when electrical power is first applied. However, there is no provision made for resetting the microprocessor also when it may be in some undefined condition due to decreases in the supply voltage. If the computation is then continued without taking account of such decreases, large errors in the result can occur.

THE INVENTION

It is an object of the present invention to provide equipment which will generate a reset pulse for a microprocessor not only when the equipment is first turned on, but also if there are supply voltage decreases which could lead to anomalies in the condition of the microprocessor.

The apparatus is to have a wide range of application, that is both the magnitude of supply voltage decrease which results in the generation of a reset pulse and the duration of the pulse should be adjustable. Additionally, the pulse which is generated when the power is first applied should have a predetermined pulse width, so that it can be differentiated from pulses resulting from a supply voltage decrease.

In a preferred embodiment of the invention, the actual output from the microprocessor is monitored so that a reset pulse is only furnished when the operation of the microprocessor has been affected. For example, a counter in the microprocessor may not have reached a predetermined count within a predetermined time or a voltage may not have reached a certain value within a given time. Such malfunction would prevent the generation of pulses which otherwise appear at regular intervals at an output of the microprocessor. Failure to receive such pulses from the microprocessor causes the generation of the reset pulse.

Preferably, a switch connected to the circuit of the present invention receives the pulses from the microprocessor. Operation of the switch prevents a capacitor in the circuit from reaching a predetermined voltage, while lack of such pulses allows it to reach the voltage. When the capacitor reaches the predetermined voltage, the reset pulse is furnished.

The switch may be a transistor switch, either a standard transistor or a field effect transistor being suitable. When any such transistor switch is used, the apparatus of the present invention can readily be constructed in integrated circuit form.

DRAWINGS ILLUSTRATING A PREFERRED EMBODIMENT

DESCRIPTION OF PREFERRED EMBODIMENTS

Figure 1:
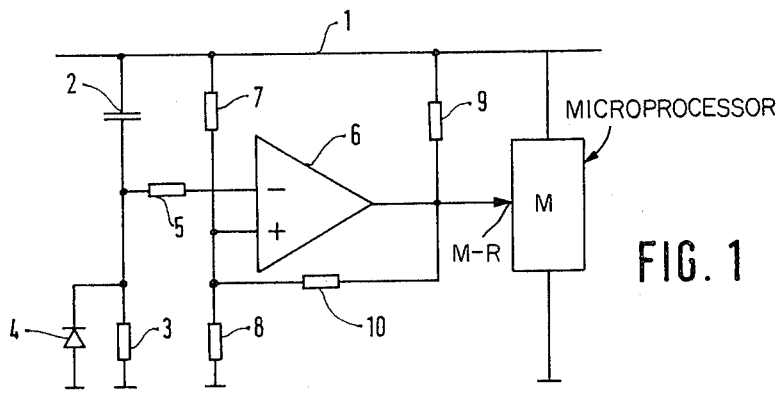
FIG. 1 is a first embodiment of a circuit according to the present invention.

In FIG. 1, the supply voltage is applied between a line 1 and a reference potential which may be ground potential. A capacitor 2 is connected to line 1 and a resistor 3 is connected from the other terminal of capacitor 2 to ground potential. A diode 4 is connected in parallel with resistor 3 with the anode of diode 4 being connected to ground potential. A protective resistor 5 is connected between the common point of capacitor 2 and resistor 3 and the inverting input of a difference amplifier 6. The direct input of amplifier 6 is connected to a voltage divider consisting of resistors 7 and 8. Resistor 7 is connected to line 1, while resistor 8 is connected to ground potential. The output of difference amplifier 6 is connected through to a resistor 9 to supply line 1 and to its direct input through a resistor 10. The reset pulse which is the subject of the present invention is derived from the output of difference amplifier 6 and applied to a microprocessor M at reset input terminal M-R.

OPERATION

After the supply voltage is first applied, the voltage at the inverting input of difference amplifier 6 is higher than that at its direct input. Therefore a "0" signal appears at the output of difference amplifier 6. The signal may be used to reset the microcomputer M. Capacitor 2 now starts to charge through resistor 3 so that, after a predetermined time, the output of difference amplifier 6 switches to a "1" signal. If the value of resistors 7 and 8 are given, the time at which the circuit switches, and therefore the duration of the "0" pulse, is determined in the main by the time constant of the RC circuit consisting of resistor 3 and capacitor 2.

If the supply voltage decreases by an amount which exceeds the forward voltage drop across the diode, capacitor 2 starts to discharge through diode 4. If, thereafter, the supply voltage is raised, then, depending upon the threshold voltage which is determined by resistors 7, 8 and 10, a pulse is generated whose pulse width depends on the value of resistor 10. The magnitude of voltage drops for which a pulse is generated thus can be defined exactly by fixing the values of resistors 7, 8 and 10. If a sensitive operational amplifier, such as, for example, type LM 139 of the firm National Semiconductor is utilized then voltage drops of as little as 0.5 V can be detected since the threshold can be fixed to be near zero.

Figure 2:
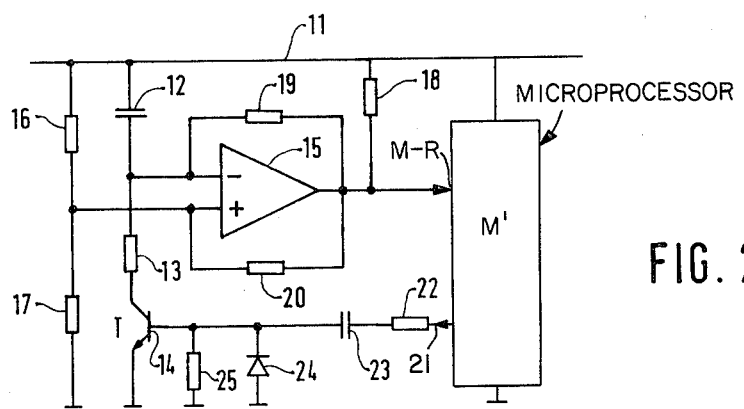
FIG. 2 is a second embodiment of the circuit of the present invention.

Embodiment of FIG. 2: The power supply line is denoted by reference numeral 11. A capacitor 12 is connected to supply line 11, the other terminal of capacitor 12 being connected through a resistor 13 and the collector-emitter circuit of a transistor T having a base 14 to ground potential. The inverting input of an operational amplifier 15 is connected to the common point of capacitor 12 and resistor 13. The direct input of operational amplifier 15 is connected to the tap of the voltage divider constituted by resistor 16 and 17. Specifically, one terminal of resistor 16 is connected to supply line 11 and one terminal of resistor 17 is connected to ground potential. A resistor 18 is connected between the output of operational amplifier 15 and supply line 11, while a resistor 19 is connected between the output and the inverting input. A resistor 20 is connected from the output of operational amplifier 15 to its direct input.

The reset pulse is derived from the output of operational amplifier 15.

An input terminal 21 is connected through a resistor 22 and a capacitor 23 to the base 14 of transistor. Additionally, a diode 24 and a resistor 25 are connected between the base of transistor 14 and ground potential. The latter components constituted a protective circuit for the transistor.

OPERATION

Figure 3:
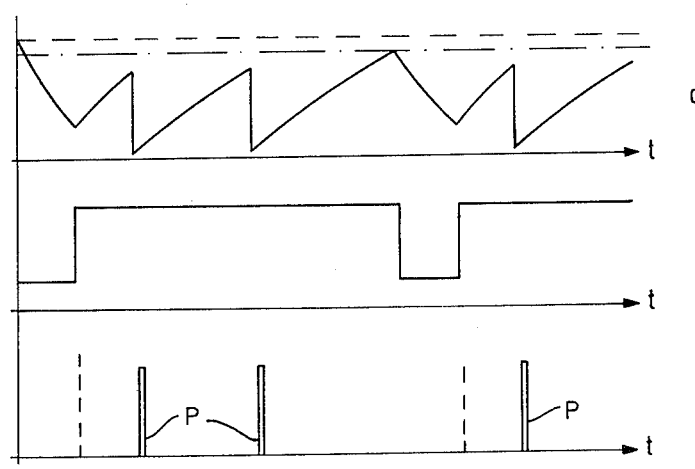
FIG. 3 shows the variation with respect to time of the voltages in different parts of the circuit of FIG. 2.

The operation of the circuit of FIG. 2 will be explained with reference to FIG. 3. Operational amplifier 15 is connected as a comparator whose thresholds are determined by resistors 16, 17 and 20. In particular, the hysteresis of the comparator is determined by resistor 20 which thus determines pulse width of the output pulse. Because of resistor 19 and capacitor 12, the circuit acts as an RC oscillator whose frequency is determined by the value of these two elements. If the polarity of the output symbol is to be reversed, capacitor 12 may be connected to ground potential. The specific connection depends on the desired potential at the output of operational amplifier 15 after the supply voltage has been switched in.

The variation with respect to time at the inverting input of operational amplifier 15 is shown in FIG. 3a, while FIG. 3b illustrates the variation with respect to time at the direct input. FIG. 3c shows, in full line, the pulses P on line 21 and, in broken line, the switch-over time of comparator 15. When the supply voltage is first switched on, the potential at the inverting input exceeds that at the direct input. The output of the operational amplifier therefore is an "0" signal, which is used to reset the apparatus connected to the output of the operational amplifier e.g. microprocessor M'. Capacitor 12 starts to charge through resistor 19, so that comparator 15 switches after a predetermined time interval (broken line, FIG. 3c. The signal at its output is now a "1" signal which discharges the capacitor. If, after the microprocessor M' has been reset, a program begins to run which, after it is completed or, for a longer program, at predetermined time intervals, causes a pulse P to be generated at the output on line 21 of the microprocessor M' in accordance with a program which has been pretested, then an omission of the pulse at line 21 is indicative of a voltage drop. Thus if such a voltage drop occurs, a pulse will not appear at input 21 to the transistor T in time to prevent capacitor 12 from discharging to such an extent that the upper threshold voltage which is shown as a dot-dash line in FIG. 3a is reached. The comparator switches so that the reset pulse again appears at the output M-R. Because of positive feedback resistor 20, the voltage at the direct input of operational amplifier 15 also drops. Capacitor 12 discharges through resistor 19 until the lower threshold is reached. Thereafter, the output of the comparator is again a "1" signal. The computer is again ready for operation so that a new program can run.

The above circuits are easy to manufacture as integrated circuits. It is particularly advantageous to incorporate them in the microcomputer.

Many variations and changes of the above described circuits will be readily apparent to one skilled in the art and are intended to be encompassed by the following claims:

I claim:

1. Apparatus for generating a pulse in response to excessive changes in the output of an electrical power supply having two terminals forming a line terminal (1) and a reference terminal, comprising a differential amplifier means (6) having a first (+) and second (−) input and an output from which the pulse is derived;

feedback circuit means (10) connected from said output of the differential amplifier means (6) to said first input of said amplifier means;

voltage divider means (7, 8) connected across the terminals of said power suply and having a voltage divider tap connected to said first input of said differential amplifier means (6);

a capacitor (2) connected to one terminal of said power supply and to said second input of said amplifier means;

a resistor (3) connected jointly to said capacitor and also to the second input of said amplifier means, and further to the other terminal of said power supply to permit charging of the capacitor (2) therethrough upon application of supply voltage to said terminals; and a diode junction (4) having a forward voltage drop connected in parallel with said resistor (3), the voltage divider means (7,8) applying a voltage to said first input of said differential amplifier means which balances the voltage applied to said second input of the differential amplifier means under charged conditions of the capacitor (2), drop of voltage of the power suply by an amount in excess of the forward voltage drop across the diode junction permitting discharge of the capacitor (2) through the diode junction (4) causing unbalance of the voltages at the first and second inputs of the differential amplifier means and switch-over of said differential amplifier means and generation of said pulse.

2. Apparatus as set forth in claim 1, wherein said first input is a direct input and said second input is an inverting input of an operational amplifier.

3. Apparatus as set forth in claim 1, wherein said diode junction comprises a diode (4).

4. Apparatus as set forth in claim 1, in combination with a microprocessor (M), said output of the differential amplifier means being connected to a reset terminal (M-R) of the microprocessor, the microprocessor being connected across the electric power supply and receiving operating power therefrom.

5. Apparatus for generating a reset pulse in response to excessive changes in the output of an electrical power supply (11) comprising an operational amplifier means (15) having a direct and an inverting input, and an output from which the pulse is derived;

feedback circuit means (20) connected from said output to said direct input of said operational amplifier means;

voltage divider means (16, 17) connected to said power supply and having a voltage divider tap connected to said direct input of said amplifier means;

a capacitor (12) connected to said inverting input of the operational amplifier means;

a resistor (13) connected to said capacitor and a first reference potential;

an additional feedback circuit means (19) connected between said output of said operational amplifier means and said inverting input;

controlled switch means (T) interconnected between said resistor and the first reference potential;

and means (21-25) controlling said switch means to change state at predetermined intervals in dependence on the voltage of said power supply, absence of recurring change-of-state of said switch means causing application of a voltage due to unusual change-of-charge state on said capacitor, and hence generation of the output pulse.

6. Apparatus as set forth in claim 5, wherein said power supply is the supply for a microprocessor;

and said means for controlling the switch means comprises control circuit means (21-25) connected to said switch means and said microprocessor for operating said switch means in accordance with output pulses from said microprocessor.

7. Apparatus as set forth in claim 6, wherein said switch means comprises a transistor.

8. Apparatus for generating reset pulses to computing equipment in response to fluctuations in supply voltage, comprising comparator means (6) having an output for furnishing said reset pulses, an inverting input, and a direct input;

voltage dividers means connected to said supply voltage, said voltage dividers means having a tap connected to said direct input of said comparator means;

feedback means (10) connected from said output to said direct input; and timing circuit means (2,3,4) having a charging time constant and a discharge time constant different from said charging time constant connected to said inverting input so that the voltage at said inverting input is raised above the voltage at said direct input in response to increases in said supply voltage and for a time period depending upon the amplitude of said increases, whereby a reset pulse having a pulse width exceeding the pulse width of reset pulses indicative of supply voltage fluctuations is generated when said voltage is first applied to said apparatus.

9. Apparatus for resetting computing equipment after supply voltage fluctuations, said computing equipment being adapted to generate control signals at predetermined time intervals when normal supply voltage is applied thereto, comprising a capacitor (12);

means for rapidly discharging said capacitor at a predetermined rate and resetting said computing equipment when the charge on said capacitor has reached a predetermined threshold value; and means (14, 21-25) connected to said capacitor and said computing equipment for rapidly charging said capacitor in response to each of said control signals, said capacitor discharging to said predetermined threshold value only in the absence of said control signals from said computing equipment.

* * * * *